United States Patent [19]

Kumar

[11] Patent Number: 5,784,292
[45] Date of Patent: Jul. 21, 1998

[54] MERGING INTEGRATED CIRCUIT MASK DATABASES FORMED BY DIFFERENT DESIGN RULES THROUGH GLOBAL MASK DATABASE EDITS

[75] Inventor: Niraj Kumar, Fremont, Calif.

[73] Assignee: Zilog, Inc., Campbell, Calif.

[21] Appl. No.: 47,162

[22] Filed: Apr. 14, 1993

Related U.S. Application Data

[63] Continuation of Ser. No. 431,924, Nov. 6, 1989, abandoned.

[51] Int. Cl.[6] .................................................. G06F 17/50
[52] U.S. Cl. ........................ 364/491; 364/489; 364/490; 345/435; 345/439; 395/500
[58] Field of Search .................................. 364/488, 489, 364/490, 491; 395/134, 135, 139, 500; 345/435, 439

[56] References Cited

U.S. PATENT DOCUMENTS

| | | | |
|---|---|---|---|
| 4,791,586 | 12/1988 | Maeda et al. | 364/491 |
| 4,805,113 | 2/1989 | Ishii et al. | 364/491 |
| 5,041,922 | 8/1991 | Cunningham et al. | 364/518 |
| 5,050,091 | 9/1991 | Rubin | 364/488 |
| 5,079,717 | 1/1992 | Miwa | 364/490 |
| 5,161,114 | 11/1992 | Akiyama | 364/490 |

OTHER PUBLICATIONS

Silvar-Lisco/UMDP™, "Universal Mask Data Preparation—Terminal User's Guide," Document No. M-MDP-6.3-TOV-02, pp. 1-38, (Jun. 1988).
Silvar-Lisco/UDRC™, "Universal Design Rule Check—Terminal User's Guide," Document No. M-DRC-6.3-TOV-01, pp. 1-113, (Jun. 1988).

*Primary Examiner*—Kenneth S. Kim
*Attorney, Agent, or Firm*—Majestic, Parsons, Siebert & Hsue

[57] ABSTRACT

The technique takes advantage of the current ability to increase the density of electronic circuit elements on an integrated circuit chip by combining onto a single chip all of the circuit elements of two or more separate circuits, even when the masks of the separate circuits have been laid out with one or more different design rules, and then connect them to operate together. A mask layout database of one of the circuits at a time is globally changed, with the use of a standard computer software package, to conform it to the design rules of the mask layout database of another circuit, either before or after the circuit databases are combined into a single database.

22 Claims, 2 Drawing Sheets

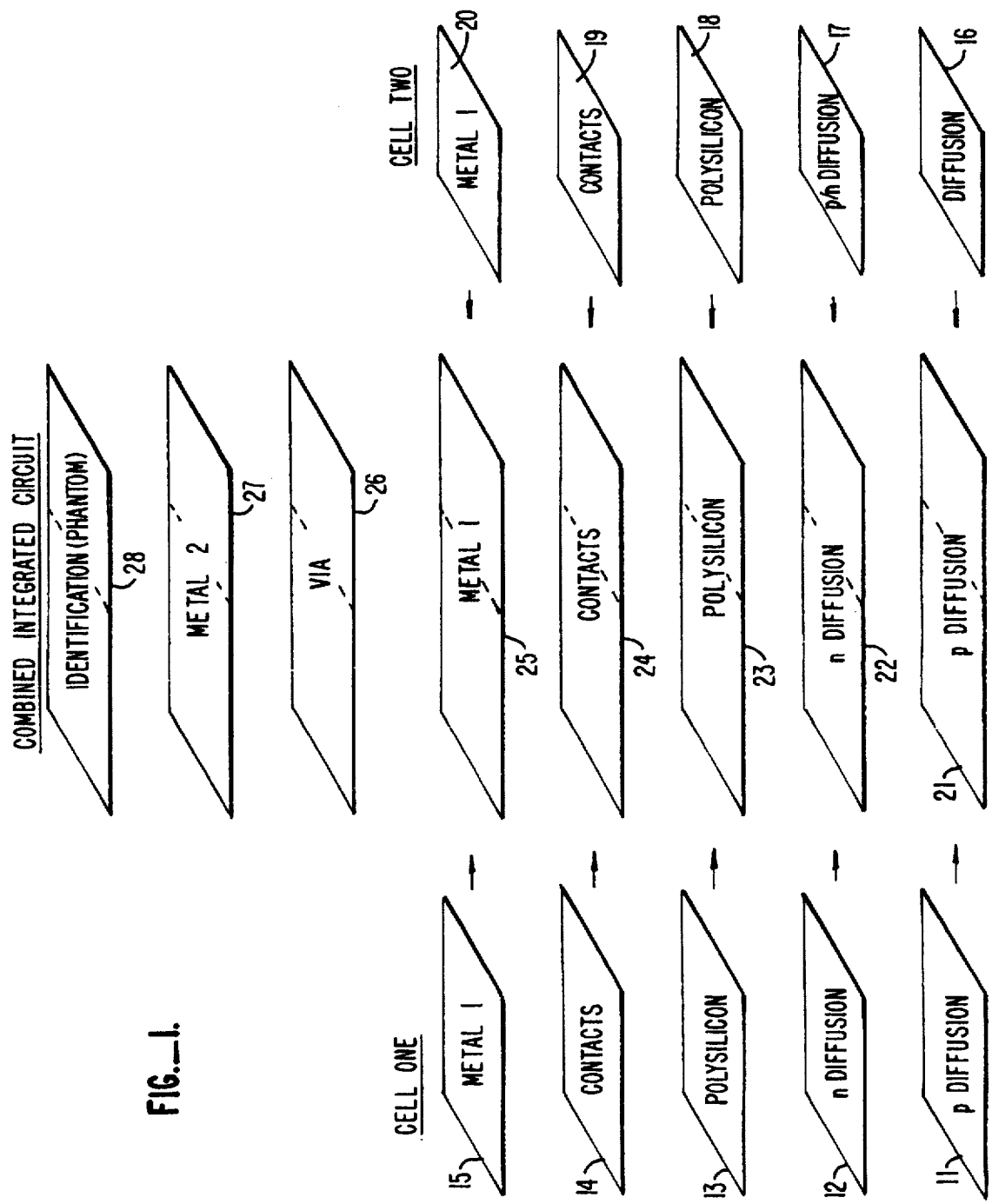
FIG._1.

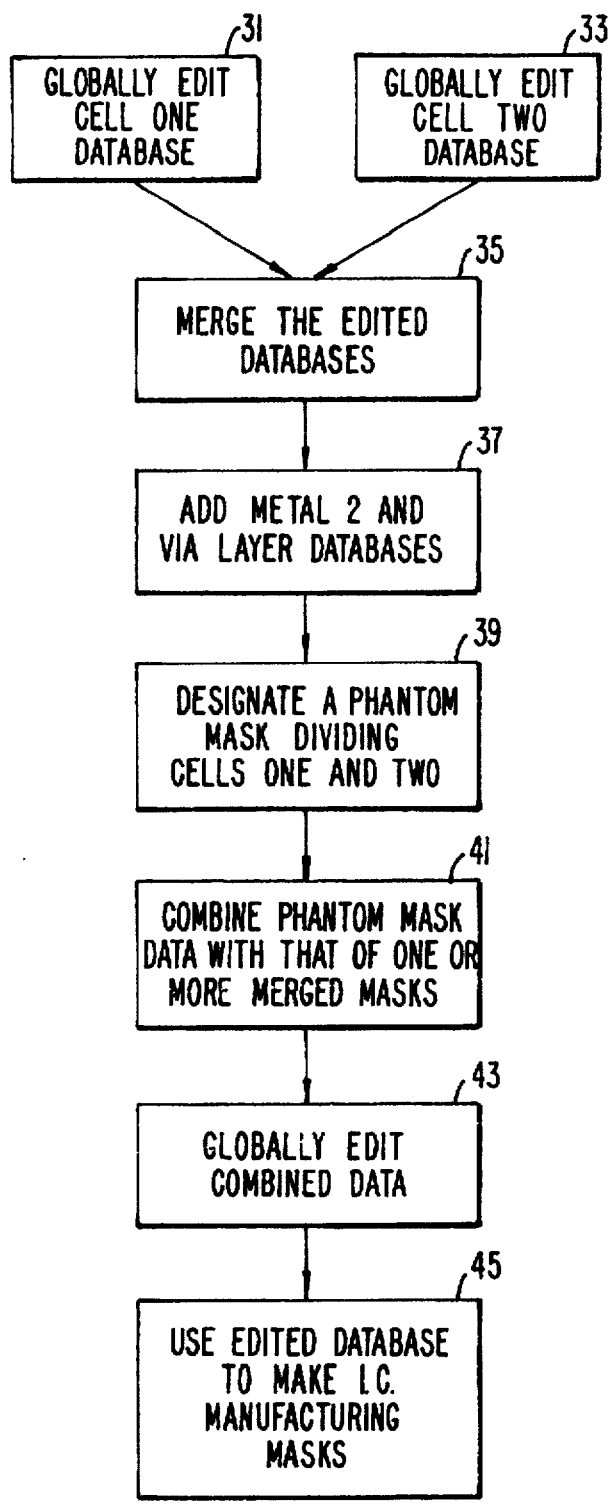
FIG._2.

MERGING INTEGRATED CIRCUIT MASK DATABASES FORMED BY DIFFERENT DESIGN RULES THROUGH GLOBAL MASK DATABASE EDITS

This is a continuation of application Ser. No. 07/431,924, filed Nov. 6, 1989, now abandoned.

BACKGROUND OF THE INVENTION

This inventions relates generally to the design of integrated circuits and, more specifically, to techniques for combining one or more existing integrated circuits onto a single integrated circuit chip.

As is well known, a large number of integrated circuit chips are manufactured on a single semiconductor wafer by a number of sequential process steps. One or more process steps are involved in altering or forming a circuit layer. Several layers are sequentially built one on top of the other. The shape of the operation performed on each layer is defined by an optical mask.

Typically, a first process step is to diffuse or implant ions into the semiconductor wafer substrate in a pattern defined by a diffusion mask. A second step is then typically to form polysilicon gates in a pattern of another mask. A next step may be to form contacts with the polysilicon and substrate diffusion regions, and that is done by yet another mask. A next step is to connect the contacted gates and diffusion regions with metal conductors, so another mask is provided for defining conductor interconnections. Although what has been described is a typical, minimum process, many integrated circuits require many more steps and thus several more layout masks for use in implementing those steps. Further, in certain cases, the sequence of the masking steps as described above may be different, and/or certain of the steps of this simple case may require two or more masks to implement.

In initially designing such an integrated circuit, a schematic diagram of the circuit is first prepared. Such a diagram shows the interconnections of all of the electronic elements that are desired to be implemented on an integrated circuit chip. Once the schematic diagram is completed, it is tested with the use of available computer software tools. After it has been determined from these tests that an electronic circuit in accordance with the schematic diagram will operate as desired, this schematic is then converted into a database that defines polygons on each of a set of masks. These masks are then optically fabricated for use in the manufacturing process.

As a result of the very large number of integrated circuits that have been designed in this manner over the past number of years, there exists a considerable library of databases for circuit mask sets. Until recently, such circuits were predominantly designed to perform a single function. For example, one integrated circuit chip may be a microprocessor, another an input-output circuit for use with the microprocessor, another chip for performing direct memory access for the system involving the other chips, and so on. With improving techniques over the years, many more circuit elements can now be formed on a given silicon substrate area than was the case when these individual, autonomous circuits were initially designed. Therefore, it is often now desirable to combine two or more such circuits onto a single integrated circuit chip. The result is economies in production, since only one chip needs to be manufactured instead of two or more, and economies in their application, since room for only one integrated circuit package need be provided in a piece of electronic equipment instead of spaces for two or more, as in the past.

However, it is not always easy to combine such circuits since those to be combined may have been designed with different sets of rules. For example, one circuit layout may have been designed with a line width of 2.0 microns, another with a line width of 1.6 microns, and it is now desired to combine them into a single integrated circuit manufactured at 0.9 microns. Another example is a CMOS circuit that is designed with separate p-type and n-type diffusion area masks while another circuit desired to be combined with it has been designed with one diffusion mask to identify the regions of a diffusion and another mask to identify which regions are of p-type and which are of n-type. Other variations in CMOS processes are also commonly encountered among circuit cells that are desired to be combined. As a result, a great deal of design effort is being devoted to modify the databases for the two or more integrated circuit mask sets to be combined in order to make them compatible by following the same design rules.

Therefore, it is a primary object of the present invention to provide a technique that simplifies the combining of two or more integrated circuit mask set databases that exist with different design rules, in order to form a mask set to manufacture a single, combined integrated circuit chip.

SUMMARY OF THE INVENTION

This and additional objects are accomplished by the present invention, wherein, briefly, differences in design rules for mask set databases are eliminated by changing the mask set database of one of the integrated circuit cells to be combined together by globally making the change with available computer software tools to all of the data of one or more mask layers at the same time. This global or batch mode change of data may either be accomplished before the two mask set databases are merged together, or after they are merged together, or different changes made at each of those times. If done after merging the cell data together, data of a phantom identification mask is used by the software program to isolate the data originating from one cell which is to be changed without affecting the data of the other cell or cells.

Each material difference in the rules used to design the integrated circuit cells which are being merged together is addressed one at a time, in sequential operations according to the above outlined general process. These differences in design rules include differences in the way that CMOS logic elements are formed, typical known structures being of a p-well, n-well or twin well type. If different, the database for the diffusion masks of one of two cells being combined together must be changed to that of the other cell so that the entire final integrated circuit is made by the same process. Another example of such a global change to the database of one of the cells is in reducing or enlarging its size. Another example is to bias or compensate the edges of the polygons formed on one or more of the masks of one of the cells in order to conform to the process technology that is going to be used to manufacture the final integrated circuit cell. Another change is to make sure that each of the databases specifies the same ultimate integrated circuit mask layer for the data of each of two masks to be combined together at that given layer.

The techniques of the present invention make it relatively easy to make these necessary design changes. Generally, a single software command is all that is necessary to conform the data for one or more mask layers at once, as appropriate, to the design specified by that of the other circuit. One such operation is all that is necessary for each of the design rules which may be different among two or more databases that are being combined into a single integrated circuit mask set database. Integrated circuits can be combined by this technique which could not be combined before because it was too time consuming and thus expensive to make the individual polygon or pattern changes with a mask layout editor software package, one polygon at a time. The result is a significantly greater number of integrated circuits that are available which provide a full set of functions that are possible as part of a single chip with improving process technology.

Additional objects, advantages and features of the present invention will become apparent from the following description of its preferred embodiments, which description should be taken in conjunction with the accompanying drawings.

BRIEF DESCRIPTION OF THE DRAWINGS

FIG. 1 schematically illustrates the combination of integrated circuit cells into a single integrated circuit to illustrate the principles of the present invention; and FIG. 2 is a flow diagram outlining an example of the technique of the present invention in combining integrated circuit cells in a manner generally illustrated in FIG. 1.

DESCRIPTION OF A PREFERRED EMBODIMENT

Referring to FIG. 1, a left-hand column conceptually illustrates the computer data defining polygons of five individual masks 11-15 used in manufacturing an existing integrated circuit. This is obviously a simplistic representation since more masks are necessary for most integrated circuits, but it will allow the technique of the present invention to be explained. The data for each of these masks forms cell one that is to be combined.

Similarly, the right-hand column illustrates data for the polygons of a set of masks 16-20 of a second existing integrated circuit. That data will be combined as cell two into the completed integrated circuit. For simplicity, the combination of only two cells into a combined integrated circuit is being explained in this example, but it will be understood that any number of two or more cells may be combined using the same techniques to be described to edit the databases to eliminate differences because of different design rules used in developing the databases.

The middle column of FIG. 1 conceptually illustrates the database for the masks of the resulting combined integrated circuit. The data for the mask 21 is a combination of the data of masks 11 and 16 from each of the two cells being combined. Similarly, the mask data 22 is a combination of mask data 12 and 17, the combined mask 23 a combination of mask data 13 and 18, the combined mask data 24 a combination of data 14 and 19, and, finally, the data of mask 25 is a combination of the data from the two cells.

Each of these combined circuit mask polygon data 21-25 can be used to make masks from which circuits can be manufactured, but, usually, there will be no interconnection or cooperation between them unless something more is done. In order to provide interconnection between the two cells, data for a via (contact) layer 26 is designed, along with data for a metal conductor layer 27. It is simplest if the layers 26 and 27 provide only for interconnection between input or output pads already existing in each of the cells, but the interconnections can also be made by layers 26 and 27 with different circuit points of the two cells. Data for a phantom mask 28 is specified as part of the process of this invention, and is described later.

As an example of differences caused by different design rules in the databases for cell one and cell two, diffusion masks 11 and 12 for cell one are illustrated to be of the type that have closed polygons to show separately where the p-type and n-type diffusions are to be formed in the substrate of the integrated circuit. That is, the mask 11 defines the area of the circuit where a p-type diffusion is to be made, and the mask 12 where an n-type diffusion is to occur. Cell two of FIG. 1 is shown to also utilize two diffusion masks 16 and 17, but they specify the areas for the p-type and n-type diffusions in a different way. Mask 16, in this example, contains polygons in a pattern where any diffusion is desired in the substrate, while the mask 17 defines which of those areas of diffusion are to be of p-type and which of n-type. This is a definite difference in the design rules used for cell one and for cell two. The data for these two mask layers of one of these cells needs to be changed to conform to that of the other cell in the combined mask layers 21 and 22 so that the two cells can be made at the same time as part of a combined integrated circuit, with a single process.

The polysilicon layer masks 13 and 18 contain polygons showing where polysilicon is to be deposited on the integrated circuit wafer. One design difference that can exist with this layer, as well as with any of the other layers, is that each of the databases for the two cells may specify the polysilicon layer to have a different layer number that is used by available computer software packages to draw the masks from the data. Obviously, before combining such layers 13 and 18 into a single layer 23, the layer numbers of each must be made the same or must both be changed to a common layer that the computer software will then recognize when dealing with the data of the combined layer 23.

The same kind of layer identification changes can be made with the contact layers 14 and 19. The data for these masks define polygons where the polysilicon or diffusion regions below them are to be contacted by metal. The masks 15 and 20 define polygons of conductors that connect these contacts in a desired way to implement the circuit operation.

There are three basic CMOS processes that are commonly utilized, and it is necessary that any mask data designed for implementing CMOS structures by different processes be changed to a common process when combined together. The three different CMOS structures are a p-well, n-well and twin well type. If cells one and two implement CMOS in different structure types, the diffusion mask of one of them needs to be changed to implement the same circuit according to the CMOS structure being implemented by the other. Or, alternatively, both of the cells can be changed into the third type of CMOS structure. It is usually the case that a given integrated circuit manufacturer who is merging the cells prefers to use one type of CMOS structure and process, and thus would likely prefer to have the final integrated circuits made in accordance with that process.

Another design rule difference that can exist between mask databases of the two cells is in its various diffusion, contact, conductor, etc. dimensions. For example, the cells can be laid out with different minimum line widths and it is desirable to make them uniform. This involves magnifying or demagnifying one or both of the mask layers (commonly called a "shrink") until they are of the same line width.

It is also usually necessary to change the biasing (compensation) of the polygons of one or more masks of one of the cells in order to make the databases of each have the same biasing. This requires moving opposing lines of a polygon either closer together or further apart by a specified absolute distance. Such biasing compensates for the effects of various processing operations on the ultimate shape of the polygon that will result on the integrated circuit. For example, if an area of diffusion, a contact or the width of a metal conductor of three microns is desired on the completed integrated circuit product, then it may be necessary to make those opposing polygon lines larger or smaller than that in order to compensate for lateral diffusion, etching and the like that may occur in process steps after that mask is utilized. That then results in the final polygon being constructed on the integrated circuit with the desired dimensions.

Making the types of changes to the mask layout database of one cell is extremely difficult and time-consuming if done manually by a layout designer utilizing the usual mask layout computer software tools. The shape of each polygon desired to be changed must be individually altered by a command from the layout designer, using such techniques. This can involve thousands of individual commands to the data of each mask layer. Since the chance of errors being created in such an operation is great, a great deal of checking and verification is then also required. The burden of this process has limited the combination of integrated circuit cells onto a single chip to those which have been designed with essentially the same rules. This limits the combined circuits to those of a single company, of a single period of time, and so forth. It limits the use of the vast number of integrated circuit layout databases that exist in a large number of companies which have been designed by many different design groups, all of which may use slightly different design rules.

The technique of the present invention, shown in the method step diagram of FIG. 2, eliminates the necessity for individual polygon change commands to be made by using available data manipulation computer software to globally perform each specific edit or change operation in a batch mode. An example of a software package which is useful for use in carrying out the invention is pattern generation software available from Silvar Lisco of Menlo Park, Calif.

The first step, utilizing such a software tool, is to individually globally edit the database of each cell, as indicated by steps 31 and 33 of FIG. 2. One example of a global type of operation is to edit data for one masking layer by specifying that all areas from one layer are to be moved to another layer. Polygon areas can also be switched (exchanged) between mask areas. These operations can be accomplished for the entire mask data by a single software command. The biasing to compensate for subsequent process steps may also be accomplished by a single command on all polygons at once of data of a given mask. Since the biasing is likely to be different on each mask, this operation is done once on a mask-by-mask basis. Magnification or demagnification (shrinks) of the entire mass set database is done by a single command. Each of the editing functions described above that may be necessary because of design rule differences in the cells being combined may be accomplished in this manner using available software tools.

In a next step 35, after all desired global editing has been separately accomplished on each of the two cell databases, the databases are merged together. Conceptually, this is the combination of the mask databases of the left- and right-hand columns of FIG. 1 into the combined integrated circuit database of the middle column, in accordance with the horizontal arrows of that illustration. Of course, each of the two combined cells are designated in the combined database to exist in separate, non-overlapping regions of the combined circuit layout.

In addition to combining the circuit cells, it is generally necessary to layout additional mask layers 26 and 27 (FIG. 1), and this is indicated by step 37 of FIG. 2. As mentioned before, this connects various portions of each circuit cell with the other. In addition, any or all of the common layers 21–25 may also be used for interconnection or for adding additional circuits. A full merging of operations of the two cells is usually desirable, and is accomplished by designing conductor and contact layouts in a normal manner.

Once that is accomplished, the complete combined integrated circuit is specified. However, it may be that some of the global editing functions described with respect to steps 31 and 33 are preferred to be deferred until after the cell databases are combined. That is, it may be more desirable to wait until after combination before doing some of the global editing operations that have been described earlier for the individual cell databases. One such editing function which is generally desired to be left until last is the biasing (compensation) since that is always the last operation done in any circuit mask layout design. Additionally, it is possible that a designer may inadvertently omit some global editing operation intended to be accomplished in steps 31 and 33 so provision is made to accomplish any of the above-mentioned global editing functions at a time after steps 35 and 37.

A first step 39 in this subsequent global editing process is to specify data of the phantom mask 28 (FIG. 1). This is nothing more than designating the coordinate dividing line between the two cells when they are combined into a single integrated circuit. Next, in step 41, that phantom mask is combined with one of the masks 21–27 with an appropriate command to the data manipulation software tool being used. This command will specify that either the area of the combined integrated circuit occupied by cell one or that occupied by cell two will be designated for an edit operation. This combination will generally be with data of a single one of the masks 21–25, but depending upon the global editing function to be implemented, can be a combination of two or more of the masks.

A next step 43 is to globally edit this combined data. If biasing is the global editing operation that is being accomplished, a single command will cause lines of polygons of specified masks to be moved an absolute amount one way or another. This operation can be individually accomplished on each of the databases for the masks 21–25 for one cell. After that, the data for the phantom mask 28 is recombined with each of the combined integrated circuit mask layer data for globally applying a different magnitude of compensation to the polygons of the other cell.

Once all of the global editing is accomplished in step 43 that is desired, the edited database is then used to make the integrated circuit masks, as indicated in a step 45. Each mask is a two-dimensional drawing of the polygon specified by the databases of the masks 21–27 (FIG. 1). Those large masks that are drawn directly from the database are then used in the integrated circuit processing machinery.

Although the various aspects of the present invention have been described with respect to its preferred embodiments, it will be understood that the invention is entitled to protection within the full scope of the appended claims.

It is claimed:

1. A method of combining polygon databases defining mask sets of at least first and second integrated circuit cells to produce a polygon database defining a mask set for a single integrated circuit that combines the functions of the first and second integrated circuit cells, wherein said databases define the respective first and second cells with at least one design rule specified differently, comprising the steps of:

editing the polygon databases for at least one of the first and second integrated circuit cells by making at least one global change to its polygon data in a manner to cause said at least one design rule to be specified the same in the databases of at said at least first and second cells, and combining the polygon databases in a manner that the data of the first and second cells occupy non-overlapping first and second respective mask area regions of the combined integrated circuit mask set.

2. The method according to claim 1 wherein the editing step includes performing editing on the polygon databases of the first and second cells before the step of combining them.

3. The method according to claim 1 wherein the editing step includes performing editing on the combined integrated circuit mask set database.

4. The method according to claim 3 wherein the editing step additionally includes the steps of:

defining data of a phantom mask of the combined integrated circuit mask layouts that outlines the mask area region of said first or second circuit cells, merging the phantom mask data and at least some of the combined integrated circuit mask polygon layout data, and editing a portion of the merged polygon mask set database lying in either of the first or second mask area regions by making a global change to its polygon data, thereby to globally change the polygon data of one of the first or second integrated circuit cells.

5. The method according to any one of claims 1–4, inclusive, wherein the editing step includes repositioning edges of the polygons of the database being edited.

6. The method according to any one of claims 1–4, inclusive, wherein the editing step includes changing at least one mask designation number of the database being edited.

7. The method according to any one of claims 1–4, inclusive, wherein the editing step includes simultaneously changing the size of a plurality of the masks of the database being edited.

8. The method according to any one of claims 1–4, inclusive, wherein the editing step includes changing at least one mask that defines areas of diffusion to define a different type of CMOS diffusion process.

9. The method according to any one of claims 1–4, inclusive, wherein the editing step includes moving regions that designate areas of one layer to designate areas of another layer, and conversely, moving regions that designate areas of said another layer to designate areas of said one layer.

10. A method of editing an integrated circuit mask layout database that has been formed by combining databases of mask polygon layouts of at least two integrated circuit cells in non-overlapping regions, comprising the following steps performed on a computer with a data manipulation software program:

defining data of a phantom mask of the combined integrated circuit mask layouts that outlines a region coincident with only one of said at least two circuit cells, merging the phantom mask data and at least some of the combined integrated circuit mask polygon layout data, and editing the merged polygon database of the mask layout of said one of the two circuit cells by making a global change to its polygon data, thereby to globally change the polygon data of one of the at least two integrated circuit cells.

11. The method according to claim 10 wherein the step of editing the merged polygon database includes providing a global repositioning of its polygon edges.

12. A method of combining polygon databases defining, with at least one different design rule, mask sets of at least first and second integrated circuit cells to produce a polygon database defining a mask set for a single integrated circuit that combines the functions of the first and second integrated circuit cells, comprising the steps of:

(a) separately editing the polygon databases for each of the first and second integrated circuit cells by making a global change to its polygon data, (b) combining the edited databases in a manner that the edited polygon data of the first and second cells occupy non-overlapping first and second respective mask area regions of the combined integrated circuit mask set, (c) defining data of a phantom mask of the combined integrated circuit mask set that outlines the region of one of the first or second mask area regions, (d) merging the phantom mask data and at least some of the combined integrated circuit mask set data, and (e) editing the merged polygon database of the mask set of one of the first or second mask area regions by making a global change to its polygon data, thereby to globally change the polygon data of one of the first and second mask area regions.

13. The method according to claim 12 wherein the step (d) includes the step of merging the phantom mask data with the combined integrated circuit mask data representing a single layer and wherein the step (e) includes editing the single layer merged database.

14. A method of producing a mask set of a single integrated electronic circuit chip that combines the functions of at least first and second separate existing integrated circuit cells, comprising the steps of:

receiving at least first and second mask set computer databases for respective of the at least first and second existing integrated circuit cells, wherein said databases define the respective first and second circuits with at least one design rule specified differently, editing one of the at least first and second existing databases by making at least one global change to data of at least one mask thereof in a manner to eliminate the difference in how said at least one design rule is specified in said databases, combining the at least first and second databases in a manner that the data of the first and second cells occupy non-overlapping first and second respective mask area regions of the combined integrated circuit mask set, and generating an optical mask set from said combined database.

15. The method according to claim 14 wherein the editing step includes performing editing on the at least first and second databases before the step of combining them.

16. The method according to claim 14 wherein the editing step includes performing editing on the combined integrated circuit mask set database.

17. The method according to claim 16 wherein the editing step includes the steps of:

defining data of a phantom mask of the combined integrated circuit mask layouts that outlines the mask area region of said first or second circuits, merging the phantom mask data and data of at least one of the combined integrated circuit mask layout data, and editing a portion of the merged mask database lying in either of the first or second mask area regions by making a global change to its data.

18. A method of producing a set of masks to manufacture a single integrated electronic circuit from at least first and second polygon databases that respectively define at least first and second sets of a plurality of masks used to make first and second integrated circuits, respectively, wherein polygons on corresponding masks of said first and second sets are formed differently with respect to one or more design features of (a) whether a p-type or an n-type diffusion is defined, (b) their integrated circuit layer number, or (c) whether a CMOS process is defined to be a p-well, n-well or twin well type, comprising the steps of:

editing polygon data of at least one mask of one of the first or second databases by a single command of pattern generation computer software in a manner to eliminate a difference in one of said design features between said first and second polygon databases, combining the first and second polygon databases in a manner to form the first and second integrated circuits in non-overlapping first and second respective mask area regions of the single integrated electronic circuit set of masks, and generating from the combined databases a set of masks to manufacture the single integrated electronic circuit.

19. The method according to claim 18 which comprises an additional step of forming a polygon database for a mask extending over said first and second respective mask area regions to define conductive interconnections therebetween.

20. The method according to claim 18 wherein editing step is performed prior to the combining step.

21. The method according to claim 18 wherein the combining step is performed prior to the editing step, and which comprises, between the combining and editing steps, the additional steps of:

defining data of a phantom mask that outlines one of the first or second mask area regions, merging the phantom mask data and data from at least one combined mask of the combined polygon database, and performing the editing step on the merged mask data.

22. The method according to claim 21 which comprises an additional step of forming a polygon database for a mask extending over said first and second respective mask area regions to define conductive interconnections therebetween.

* * * * *